(12) United States Patent
Chang et al.

(10) Patent No.: US 7,467,882 B2
(45) Date of Patent: Dec. 23, 2008

(54) LIGHT-EMITTING DIODE HEAT-DISSIPATING MODULE

(76) Inventors: Kun-Jung Chang, No.392, Zhuliao Rd., Dashu Shiang, Kaohsiung County (TW); Ching-Yuan Juan, No.392, Zhuliao Rd., Dashu Shiang, Kaohsiung County (TW); Kuo-Chun Lin, No.392, Zhuliao Rd., Dashu Shiang, Kaohsiung County (TW)

( * ) Notice: Subject to any disclaimer, the term of this patent is extended or adjusted under 35 U.S.C. 154(b) by 97 days.

(21) Appl. No.: 11/804,186

(22) Filed: May 17, 2007

(65) Prior Publication Data

US 2008/0285285 A1 Nov. 20, 2008

(51) Int. Cl.
*B60Q 1/06* (2006.01)
*F21V 29/00* (2006.01)

(52) U.S. Cl. .................. 362/373; 362/632; 362/633; 353/52

(58) Field of Classification Search .......... 362/600, 362/612, 613, 632, 633, 634, 561, 218, 264, 362/294, 345, 373, 800; 349/161, 65; 353/52, 353/55, 58

See application file for complete search history.

(56) References Cited

U.S. PATENT DOCUMENTS

| 7,252,385 | B2 * | 8/2007 | Engle et al. .................. 353/52 |
| 7,259,964 | B2 * | 8/2007 | Yamamura et al. .......... 361/697 |
| 2006/0181670 | A1 * | 8/2006 | Kurokawa et al. .......... 349/161 |
| 2006/0203206 | A1 * | 9/2006 | Kim ............................ 353/58 |
| 2006/0245214 | A1 * | 11/2006 | Kim ............................ 362/632 |

* cited by examiner

*Primary Examiner*—Jacob Y Choi
(74) *Attorney, Agent, or Firm*—Frenkel & Associates, P.C.

(57) ABSTRACT

The present invention discloses a LED (Light-Emitting Diode) heat-dissipating module, which comprises a heat-dissipating fin, a heat-conduction pipe, a LED illumination module and a casing. The heat-dissipating fin has an insertion/press-fit member inserted by or press-fitted to the heat-conduction pipe. The heat-conduction pipe has a contact region contacting the LED illumination module. In the application of the present invention, the LED illumination module is installed on the contact regions of several heat-conduction pipes inserted into or press-fitted to the heat-dissipating fins; thus, the heat generated by the LED illumination module can be effectively dissipated. Then, the LED illumination module is placed inside the casing having an accommodation space. Thus, heat can be conducted via the heat-conduction pipe to the heat-dissipating fin and then fast dissipated therefrom even though the LED illumination module is placed inside the casing.

4 Claims, 15 Drawing Sheets

LIGHT-EMITTING DIODE HEAT-DISSIPATING MODULE

FIELD OF THE INVENTION

The present invention relates to a LED (Light-Emitting Diode) heat-dissipating module, particularly to a LED heat-dissipating module having a casing with an accommodation space.

BACKGROUND OF THE INVENTION

Refer to FIG. 1. When a conventional LED illumination module A20 is arranged inside a casing A10 with an accommodation space, the casing 10 usually has several slots A11 formed on the place where the LED illumination module A20 is installed. However, such a technology has the following disadvantages:

1. The slots A11 are usually insufficient to dissipate the heat generated by the LED illumination module A20; and
2. As the LED illumination module A20 is arranged inside the casing A10, the temperature of the casing A10 will rise when heat cannot be fully dissipated, or even worse: the casing A10 or other elements are damaged.

SUMMARY OF THE INVENTION

The primary objective of the present invention is to provide a LED (Light-Emitting Diode) heat-dissipating module, which can effectively dissipate the heat generated by a LED illumination module.

To achieve the abovementioned objective, the present invention proposes a LED heat-dissipating module, which comprises a heat-dissipating fin, a heat-conduction pipe, a LED illumination module and a casing. One side of the heat-dissipating fin has an insertion/press-fit member inserted by or press-fitted to the heat-conduction pipe. The other side of the heat-dissipating fin has a heat-dissipating member. The heat-conduction pipe has a contact region contacting the LED illumination module. In the present invention, the LED illumination module is installed on a heat-conduction pipe inserted into or press-fitted to a heat-dissipating fin to increase the efficiency of dissipating the heat generated by the LED illumination module. Then, the LED heat-dissipating module is placed inside a casing having an accommodation space. Even though the LED illumination module is placed inside the casing, heat can still be conducted via the heat-conduction pipe to the heat-dissipating fin and then fast dissipated therefrom.

DETAILED DESCRIPTION OF THE PREFERRED EMBODIMENTS

Figure 1:
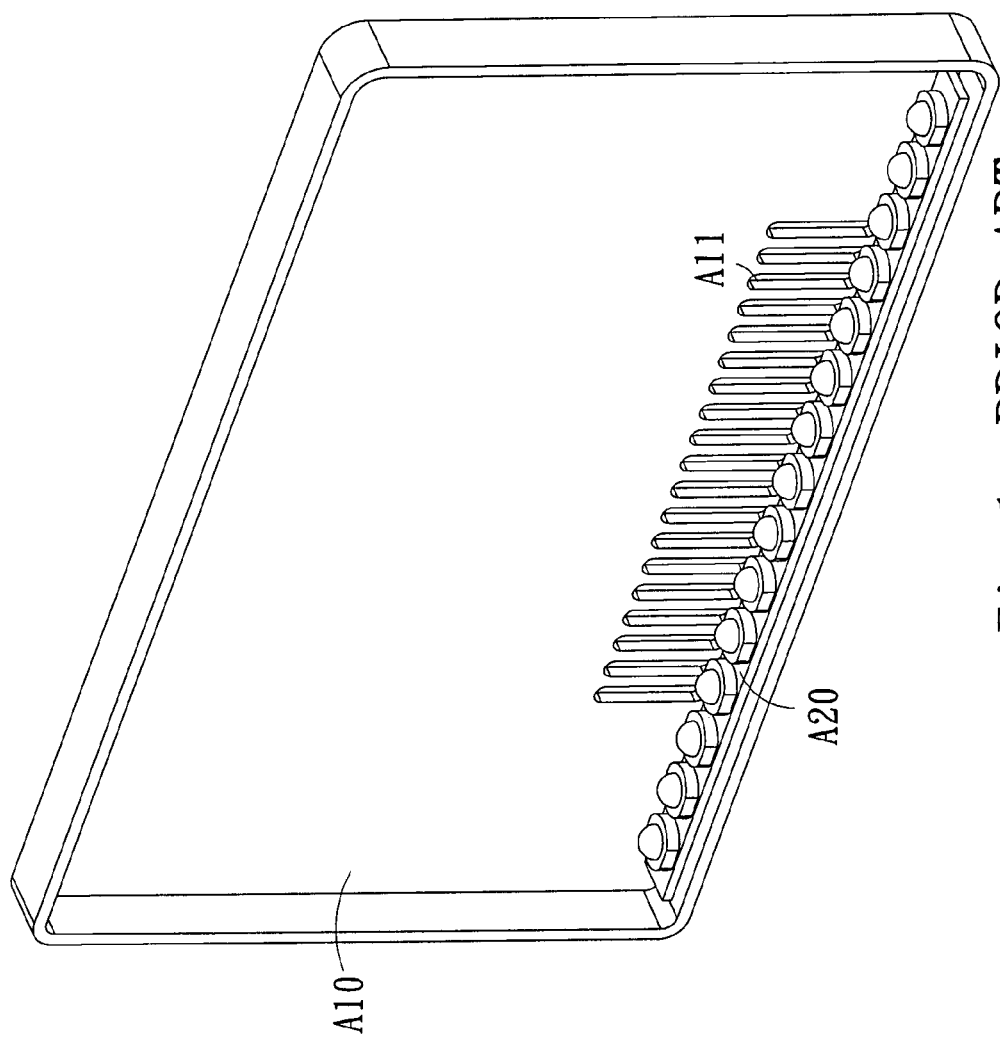
FIG. 1 is a perspective view of the assemblage of a conventional LED heat-dissipating module.
Figure 2A:
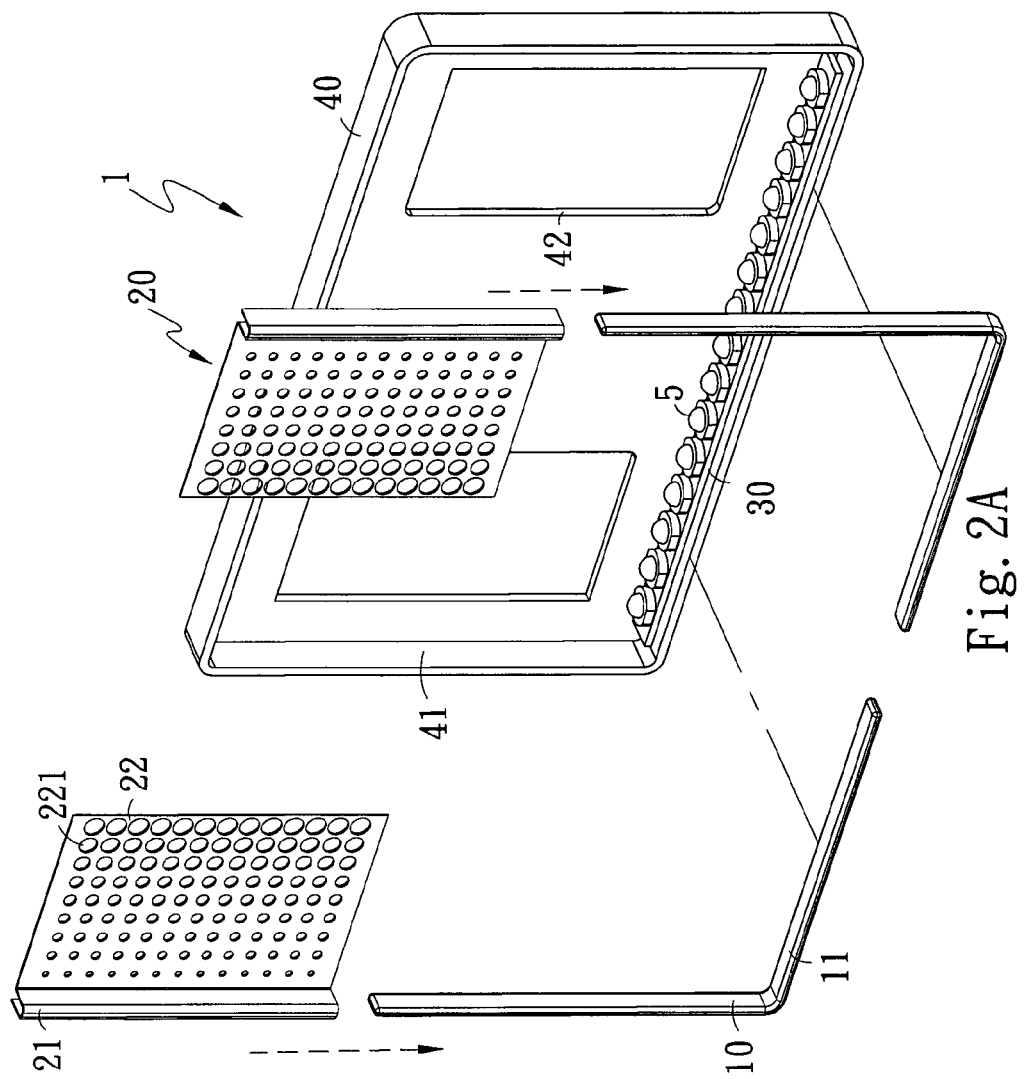
FIG. 2A is a perspective exploded view of the LED heat-dissipating module according to the present invention.
Figure 2B:
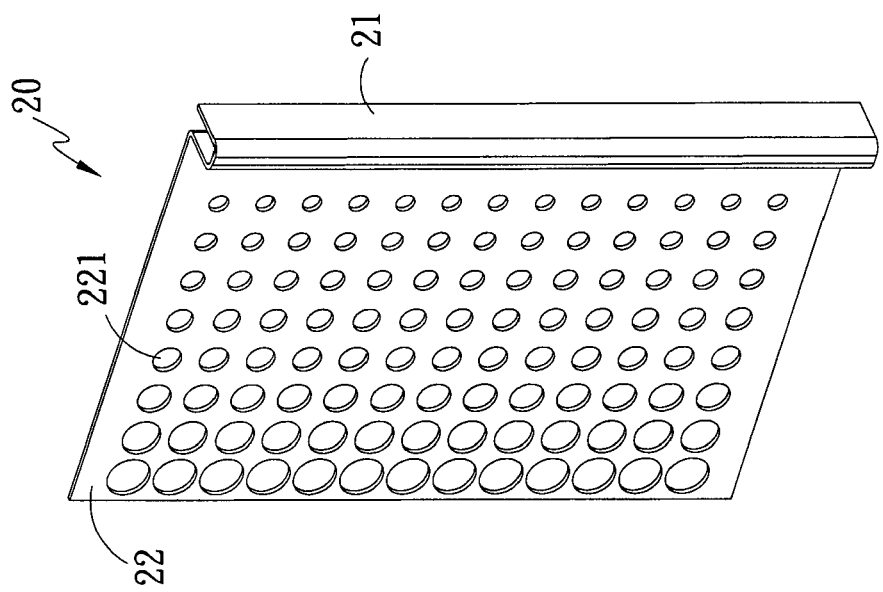
FIG. 2B is a perspective view schematically showing the heat-dissipating fin according to one embodiment of the present invention.
Figure 3:
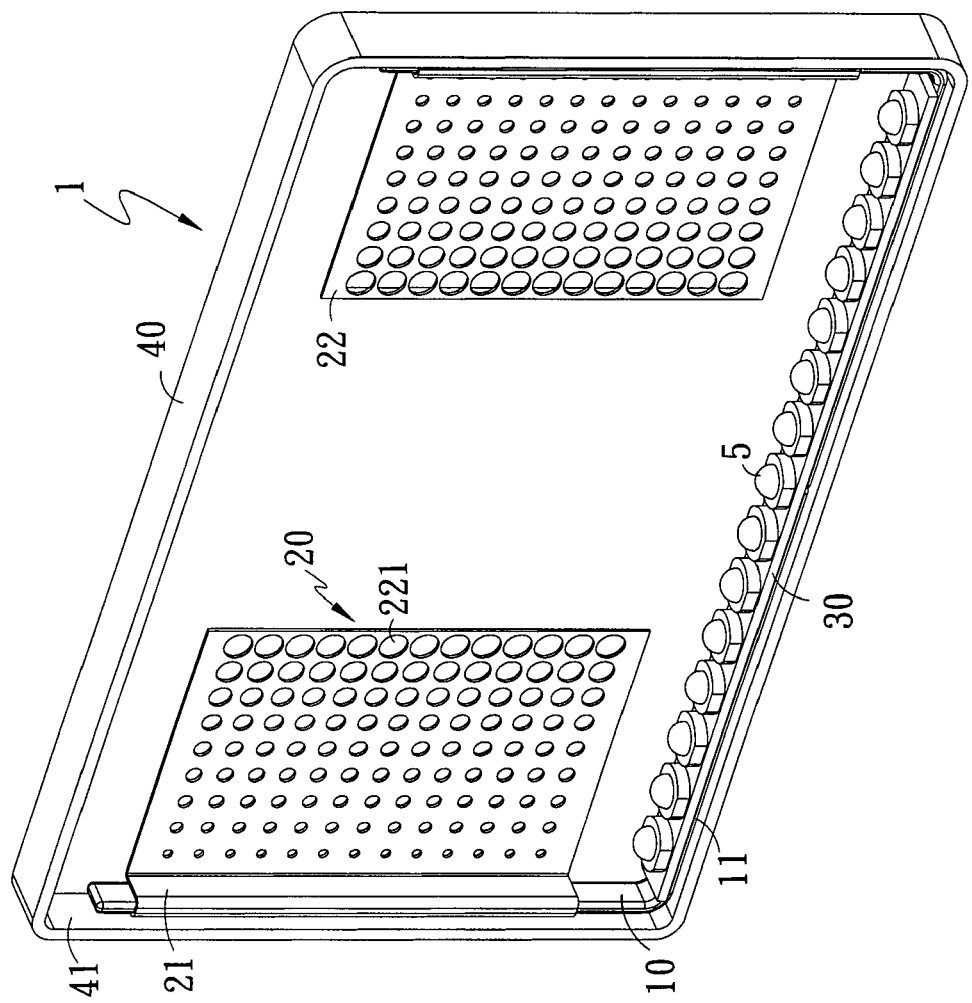
FIG. 3 is a perspective view of the assemblage of the LED heat-dissipating module according to the present invention.
Figure 4:
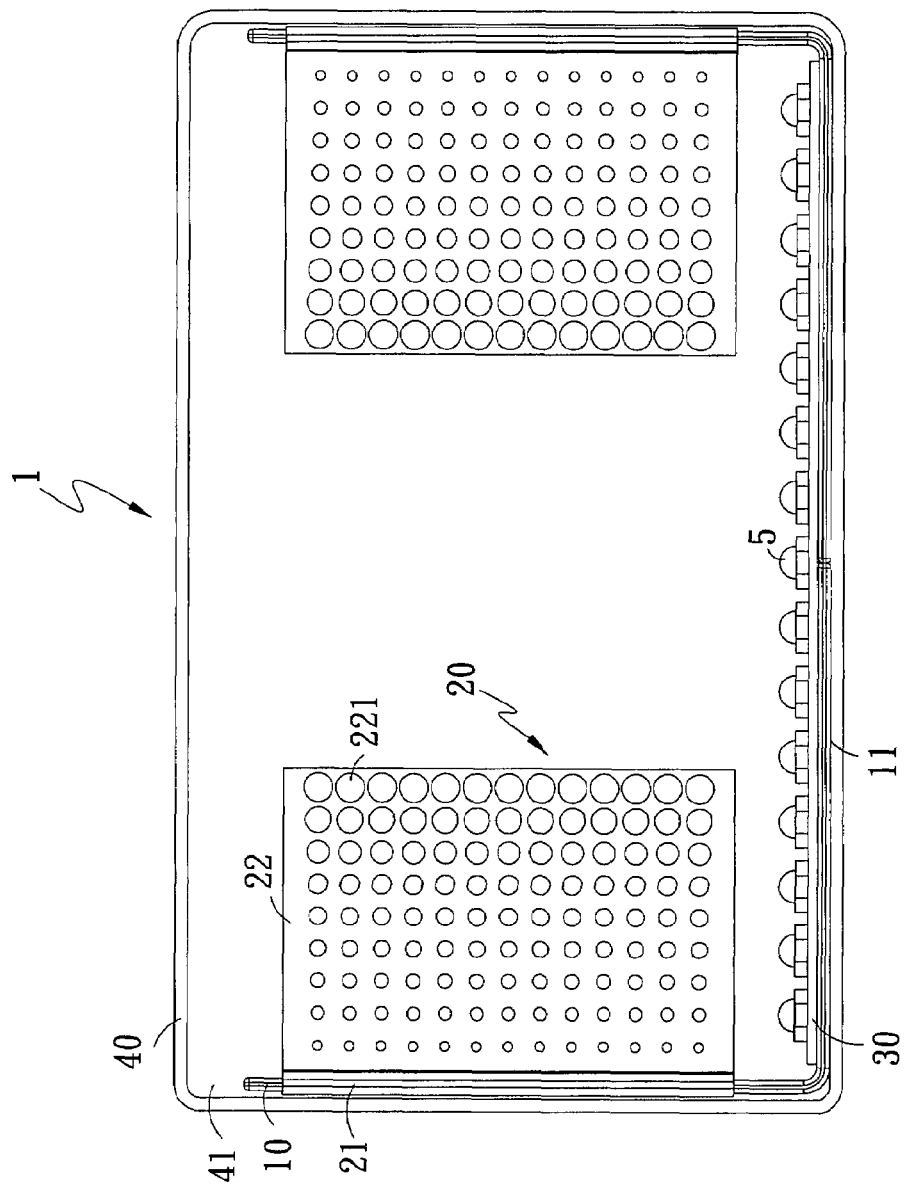
FIG. 4 is a front view of the LED heat-dissipating module according to the present invention.
Figure 5A:
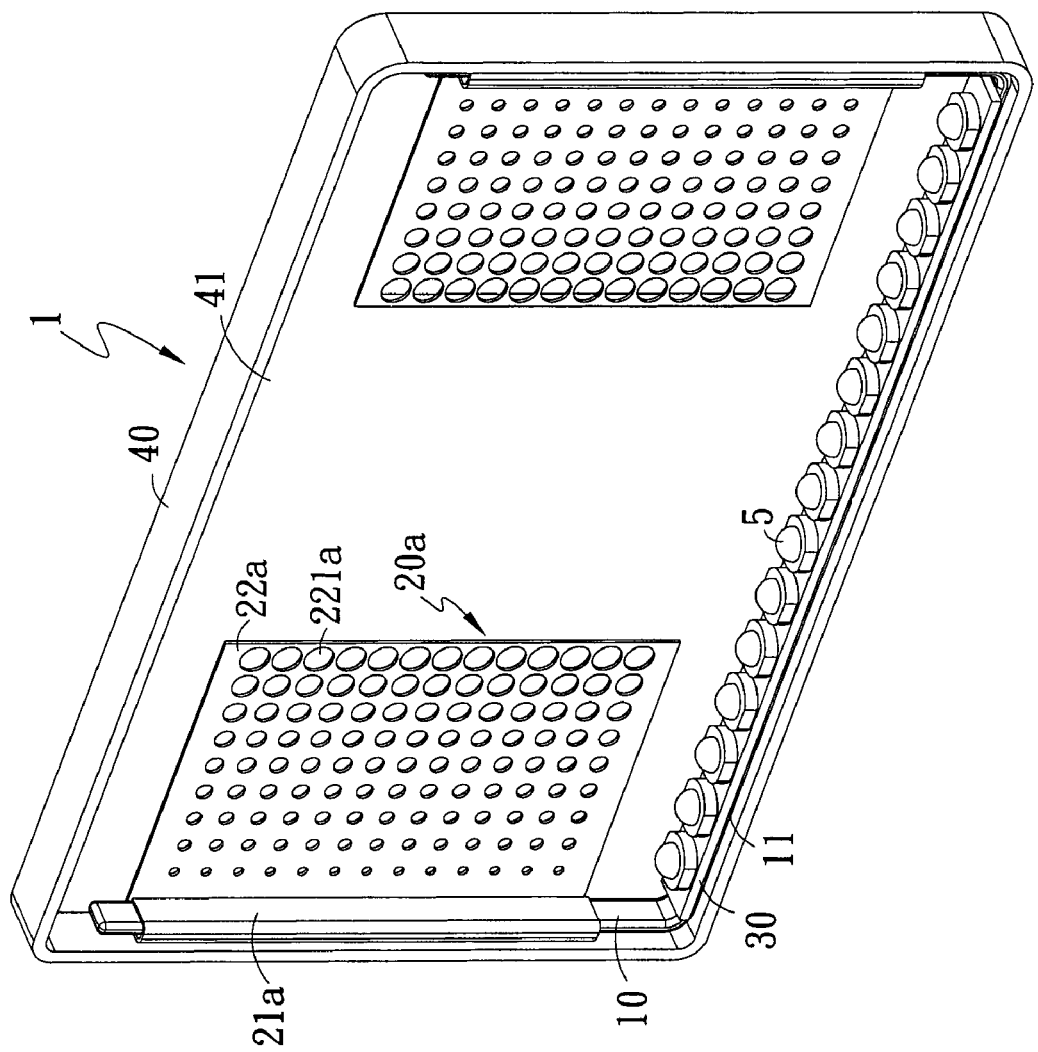
FIG. 5A is a perspective view of the assemblage of the heat-dissipating fin according to another embodiment of the present invention.
Figure 5B:
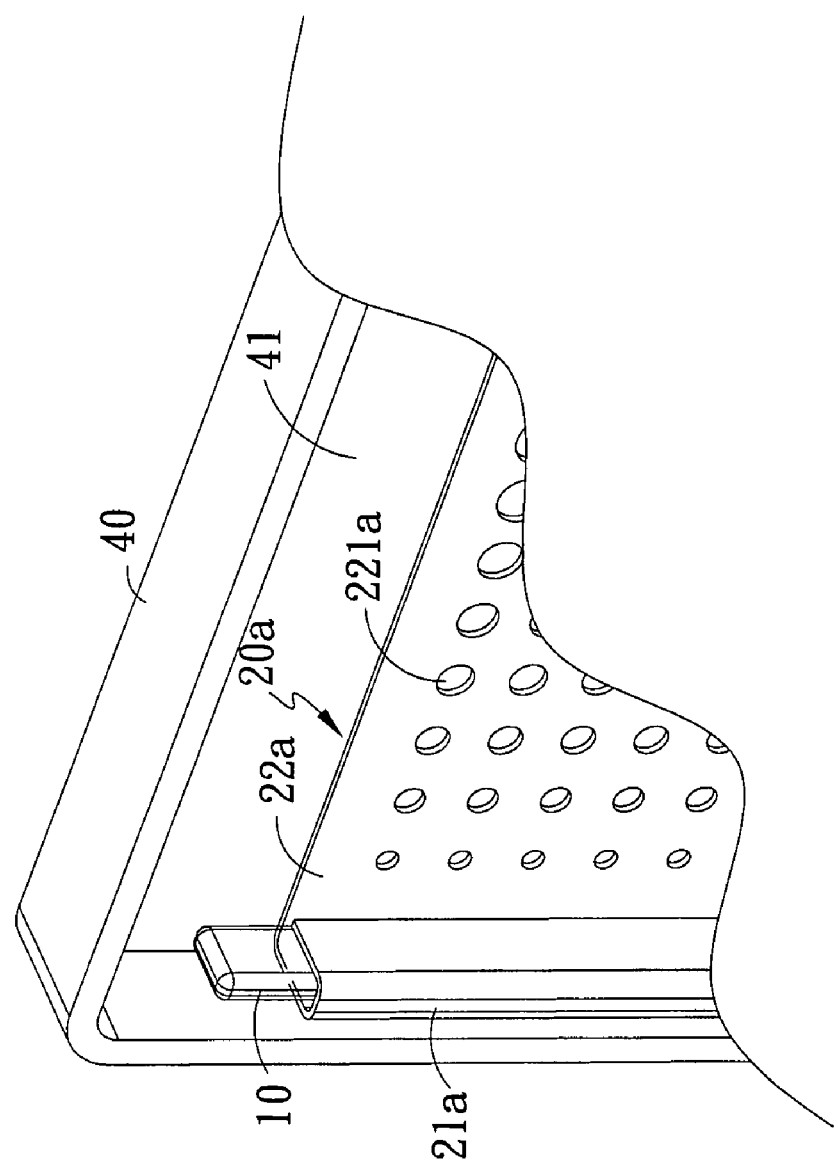
FIG. 5B is a partially-enlarged view of the heat-dissipating fin according to another embodiment of the present invention.
Figure 6:
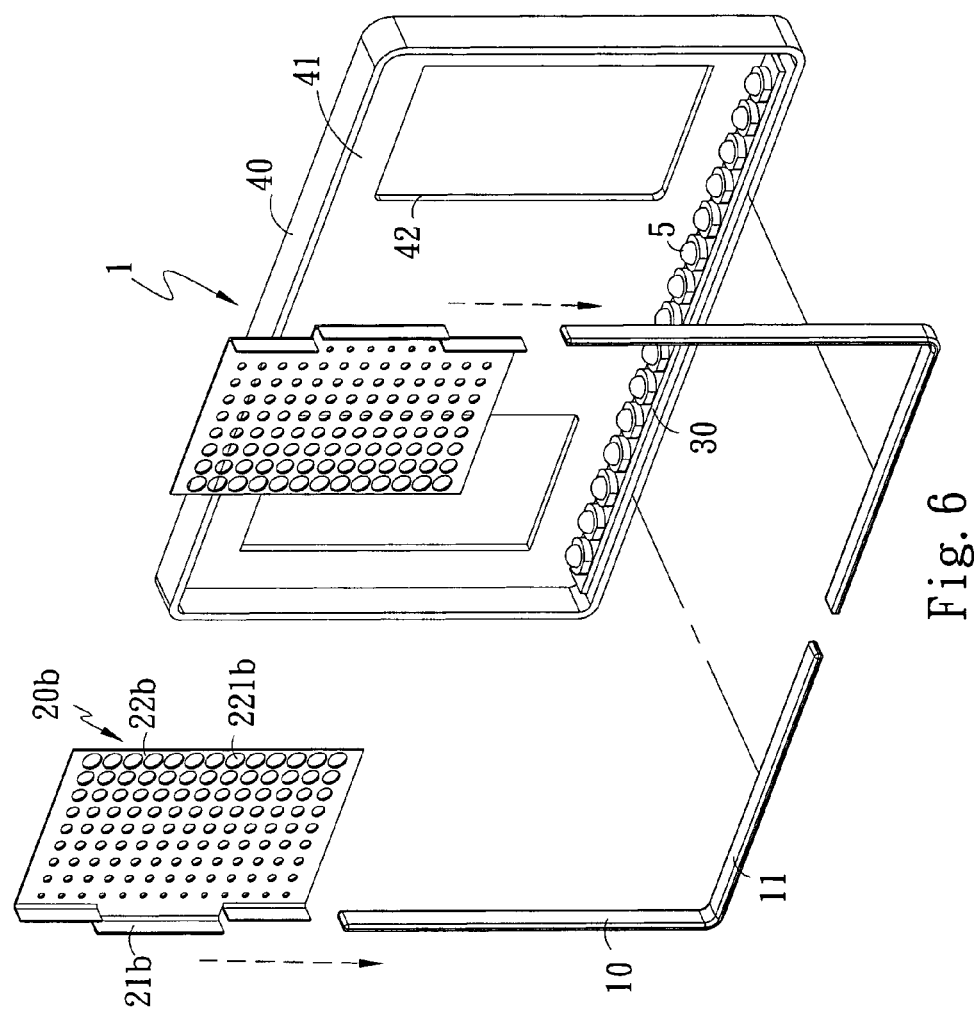
FIG. 6 is a perspective exploded view of the heat-dissipating fin according to yet another embodiment of the present invention.
Figure 7:
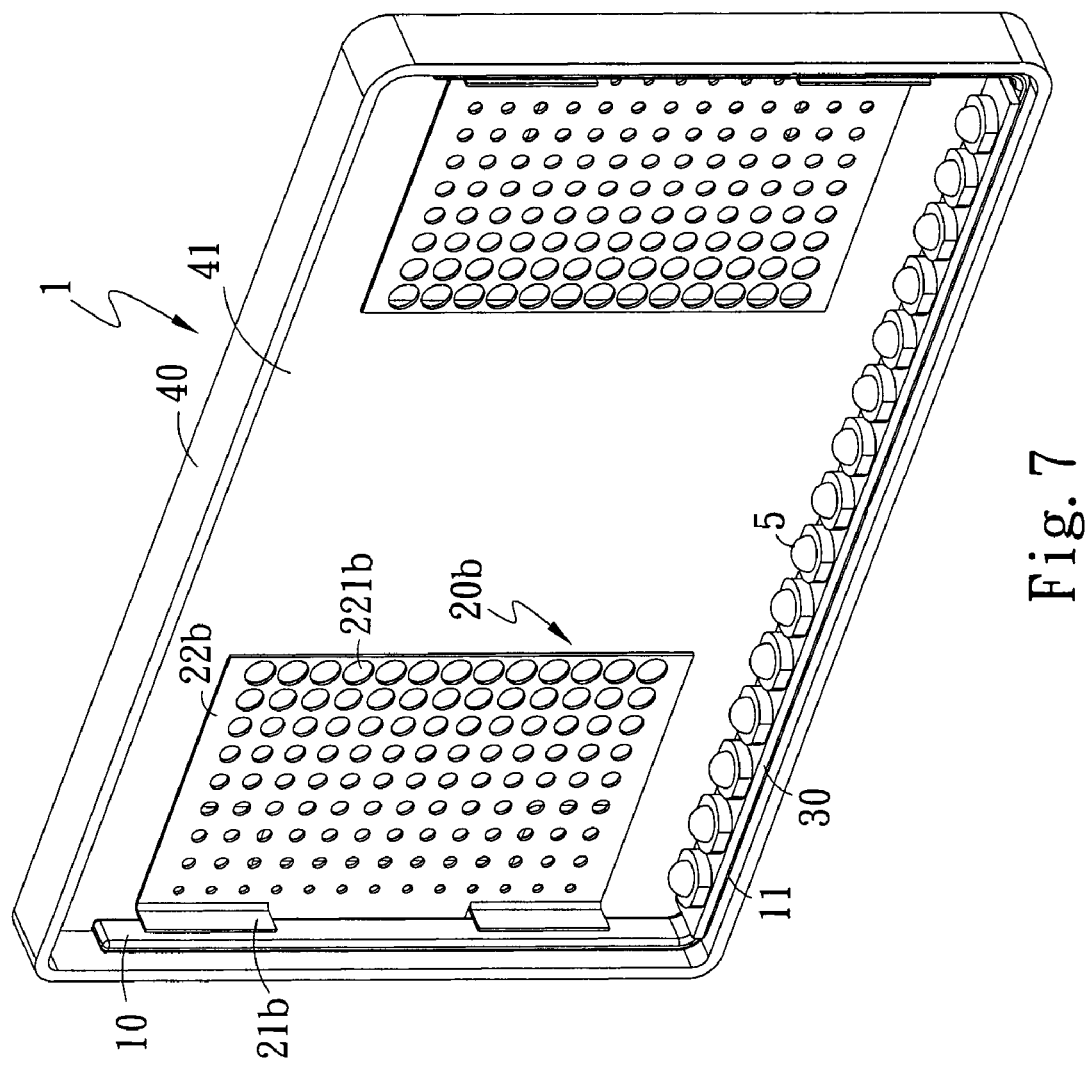
FIG. 7 is a perspective view of the assemblage of the heat-dissipating fin according to yet another embodiment of the present invention.
Figure 8:
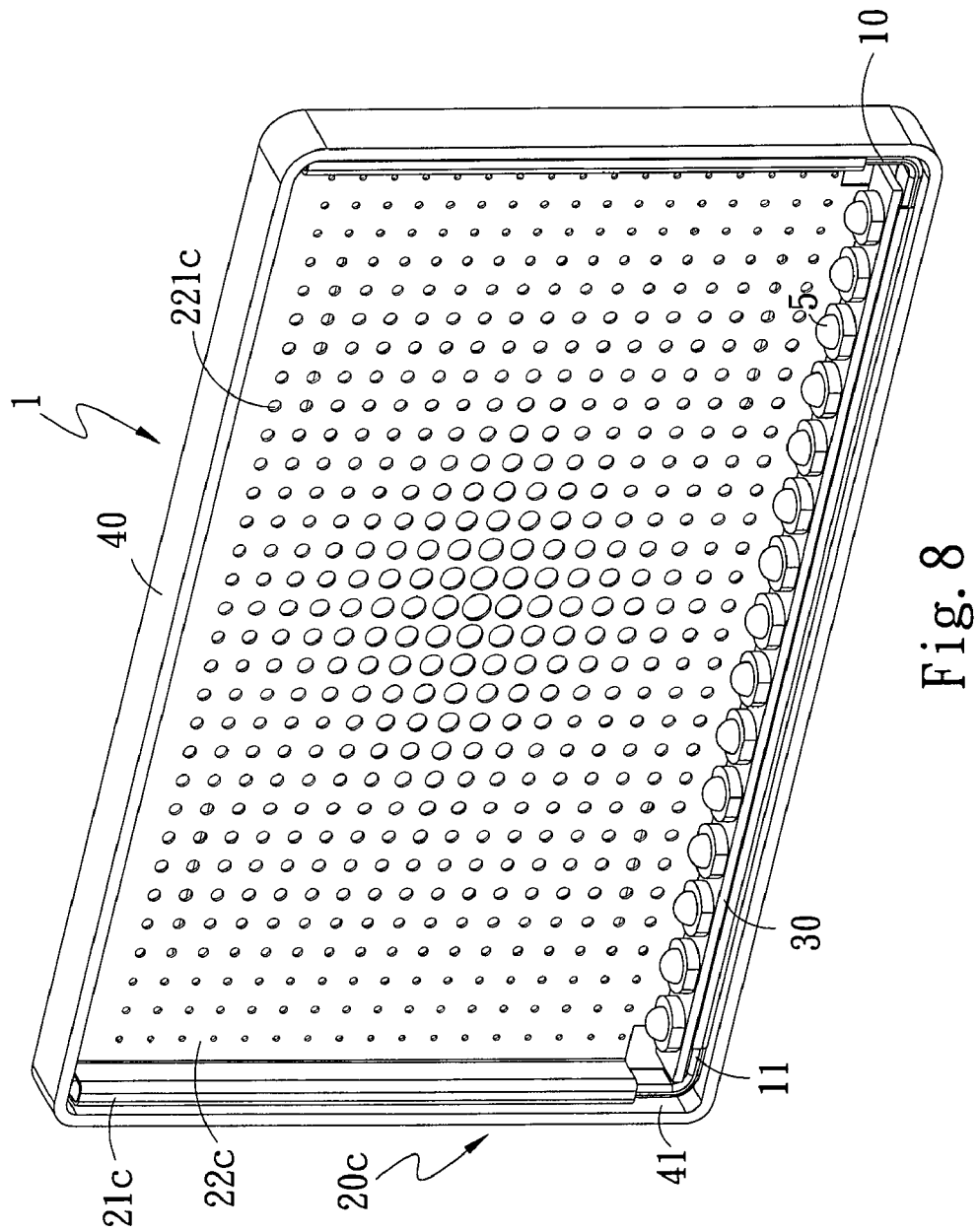
FIG. 8 is a perspective view of the assemblage of the heat-dissipating fin according to still another embodiment of the present invention.
Figure 9:
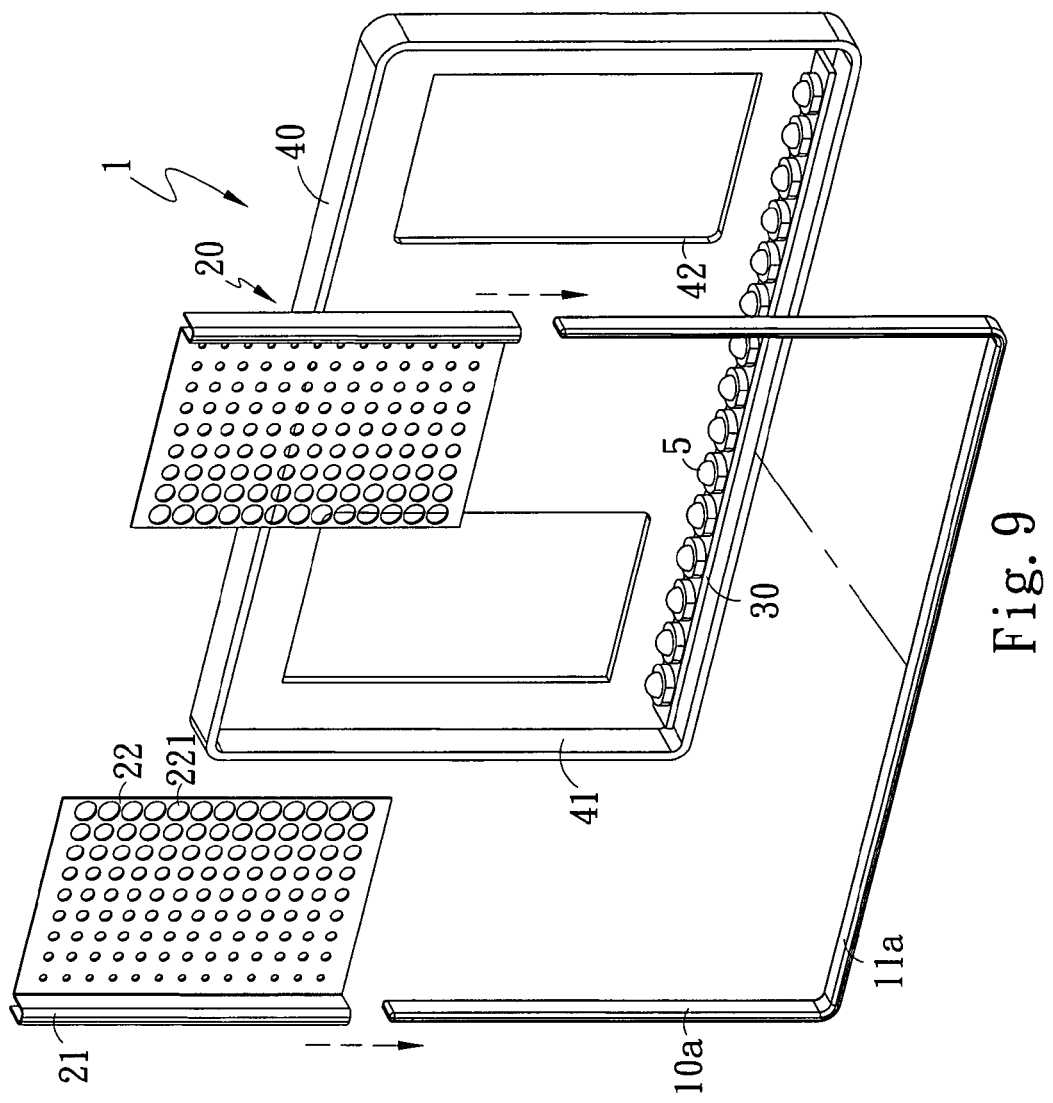
FIG. 9 is a perspective exploded view of the heat-conduction pipe according to further another embodiment of the present invention.
Figure 10:
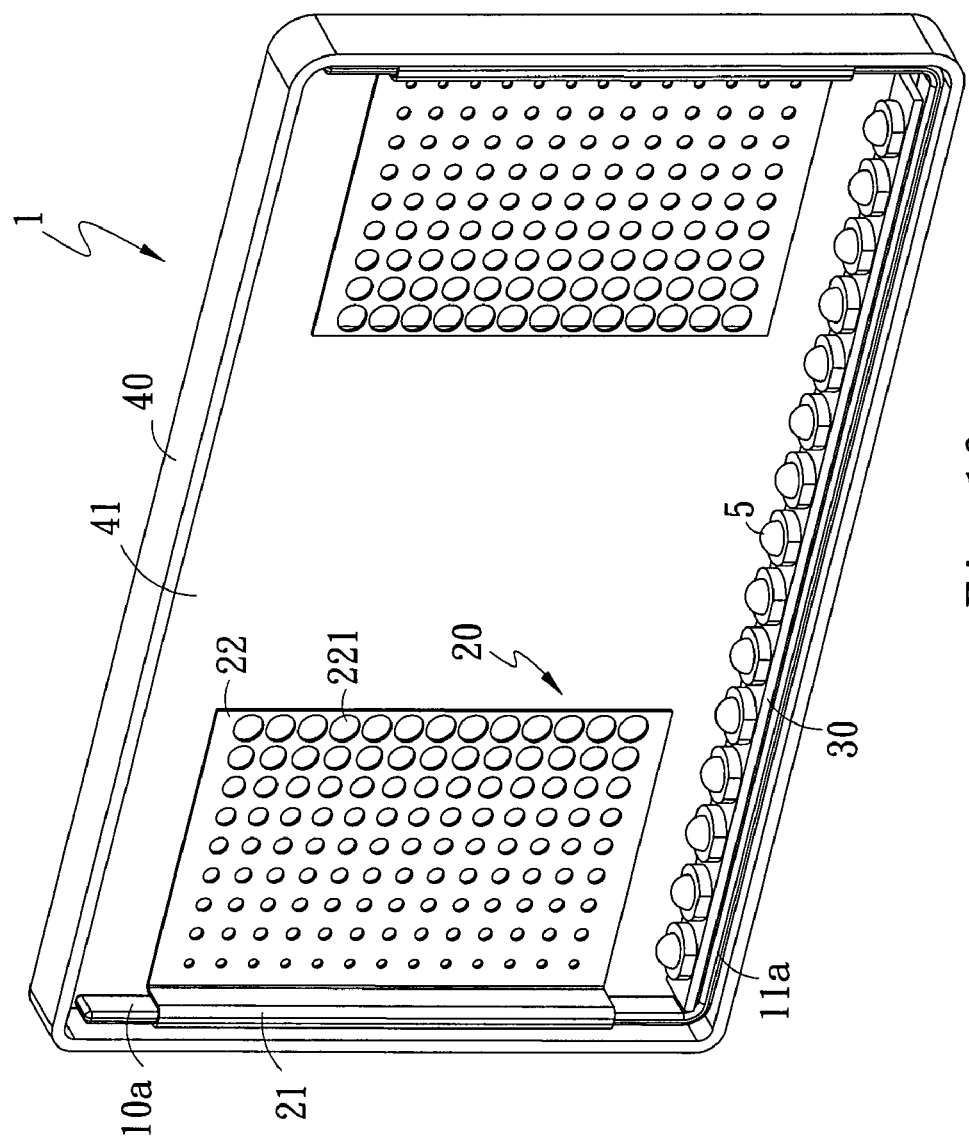
FIG. 10 is a perspective view of the assemblage of the heat-conduction pipe according to further another embodiment of the present invention.
Figure 11:
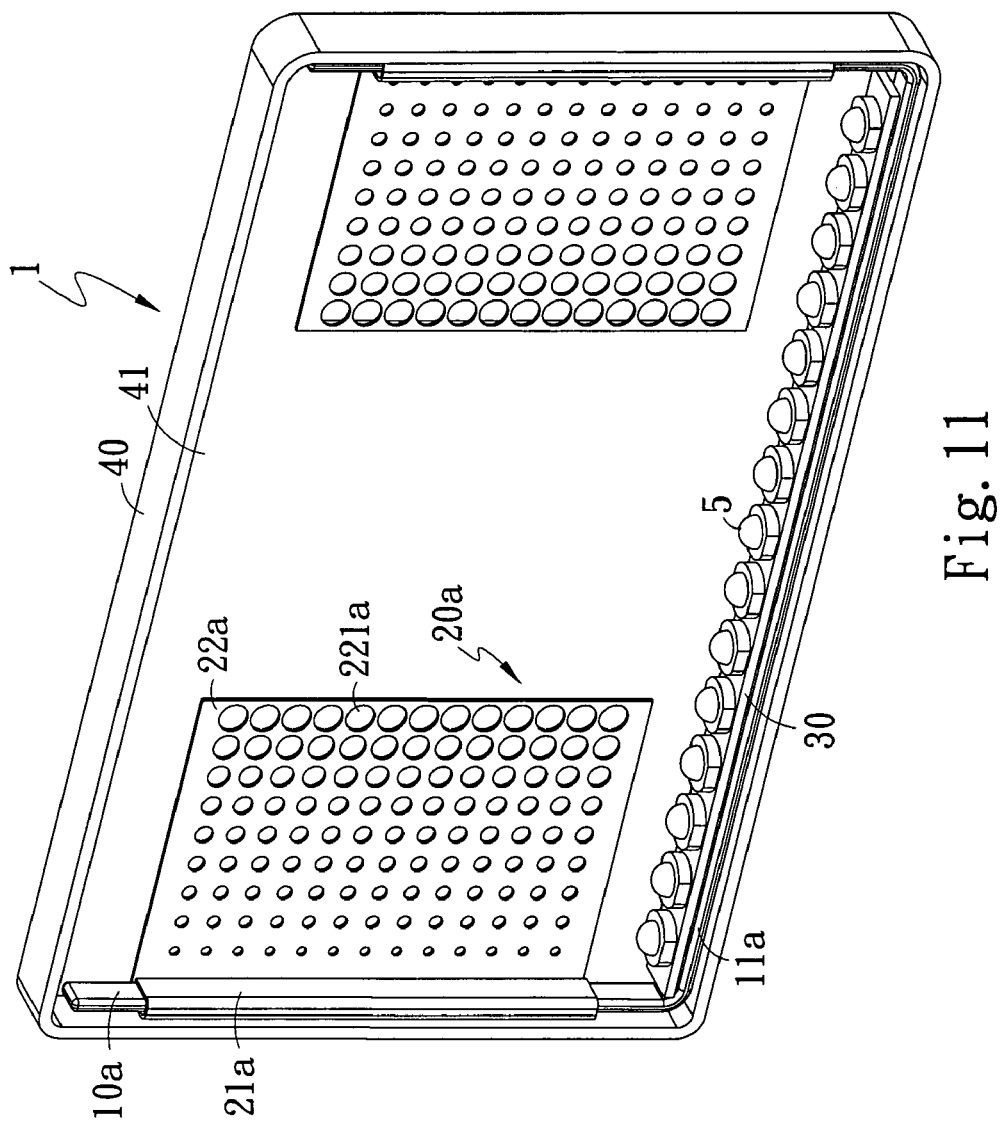
FIG. 11 is a perspective view of the assemblage of the heat-conduction pipe and the heat-dissipating fin according to yet further another embodiment of the present invention.
Figure 12:
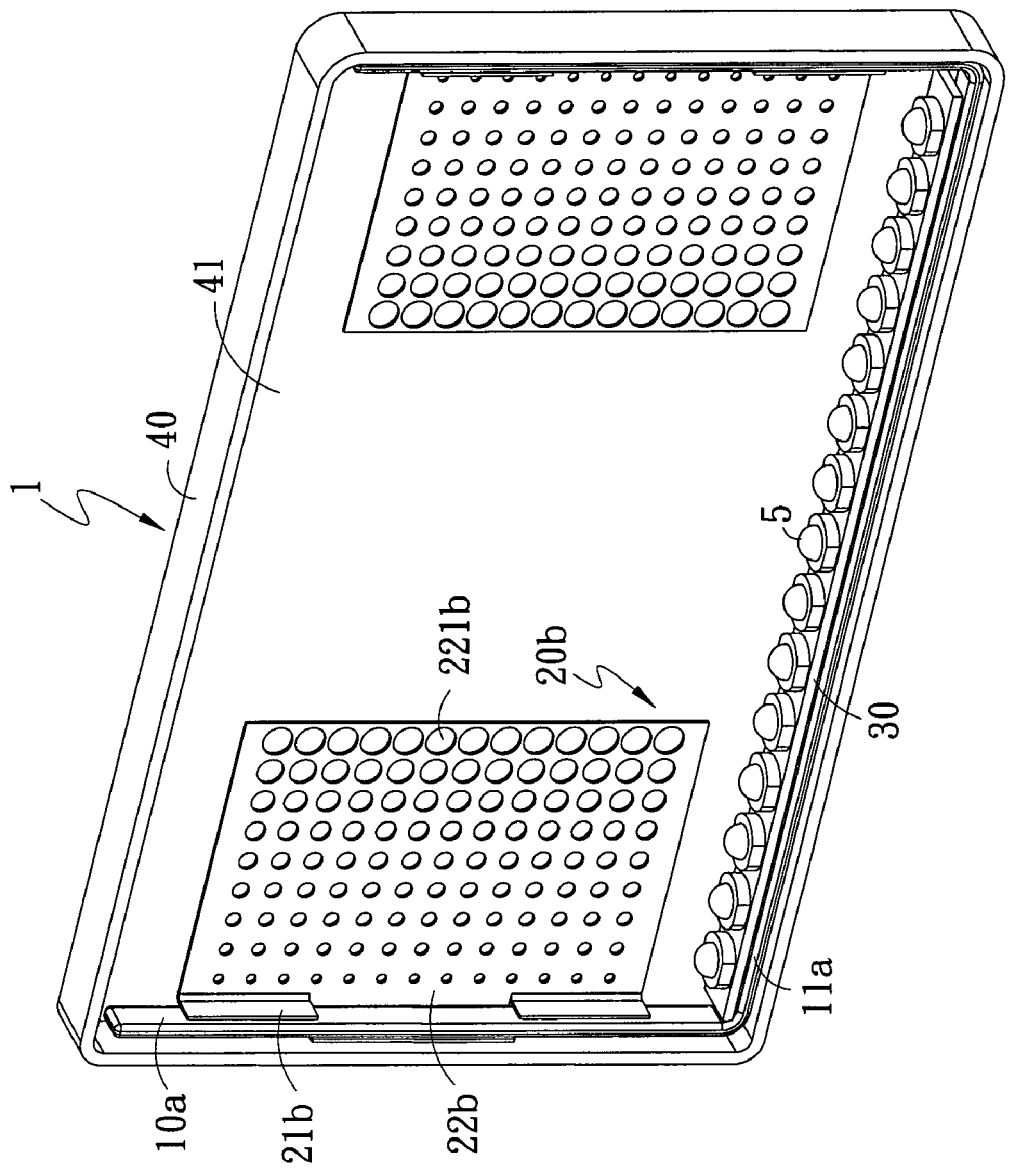
FIG. 12 is a perspective view of the assemblage of the heat-conduction pipe according to further another embodiment of the present invention and the heat-dissipating fin according to yet another embodiment of the present invention.
Figure 13:
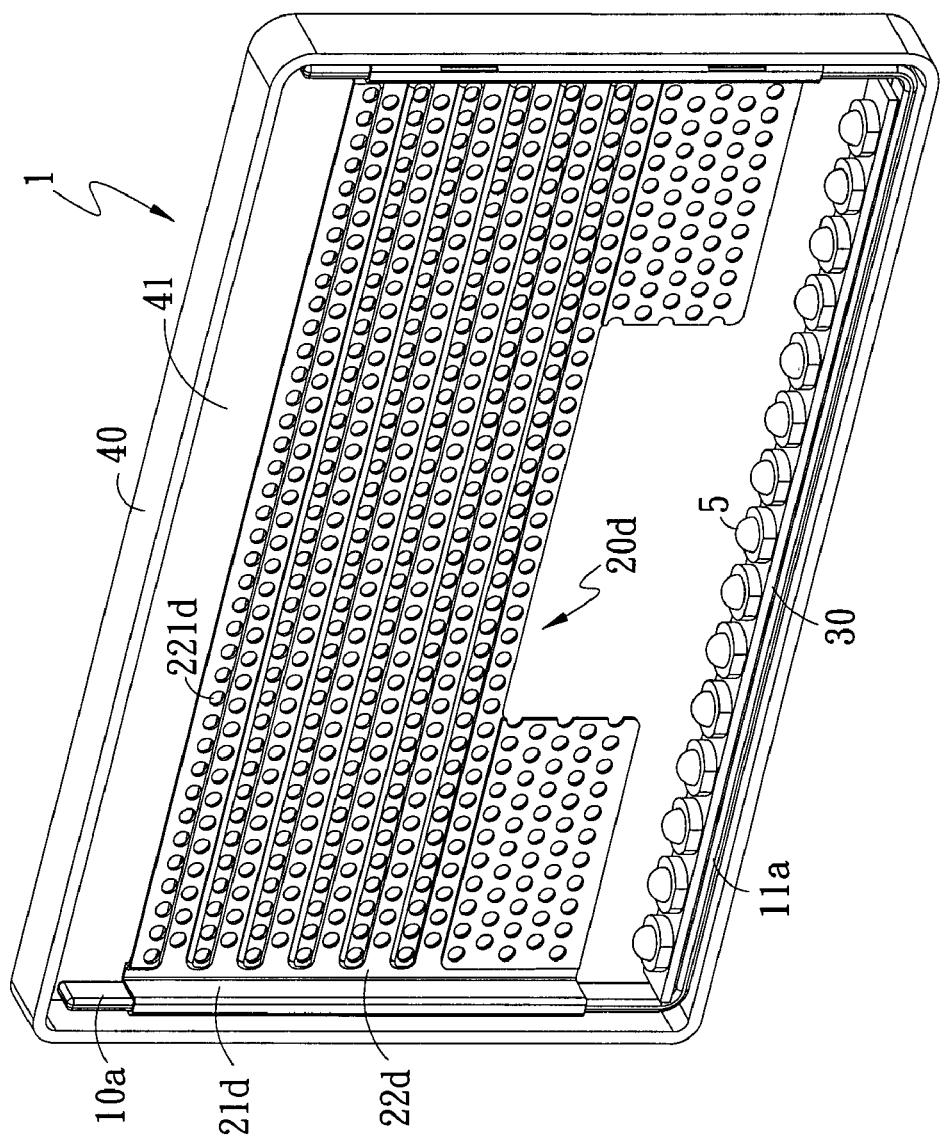
FIG. 13 is a perspective view of the assemblage of the heat-dissipating fin according to still further another embodiment of the present invention.

Refer to FIGS. 2A, 2B, 3 and 4. The LED heat-dissipating module 1 of the present invention comprises a heat-dissipating fin 20, a heat-conduction pipe 10, a LED illumination module 30 and a casing 40. One side of the heat-dissipating fin 20 has an insertion/press-fit member 21 inserted by or press-fitted to the heat-conduction pipe 10. The other side of the heat-dissipating fin 20 has a heat-dissipating member 22, and the heat-dissipating member 22 has a plurality of through-holes 221 used to increase the heat-dissipating efficiency of the heat-dissipating member 22. As shown in FIG. 13, the through-holes 221d may be of the same size. As shown in FIG. 3, the size of the through-holes 221 may alternatively increase from the side near the insertion/press-fit member 21 of the heat-dissipating fin 20 to the other side, which not only can effectively increase the heat-dissipating efficiency of the heat-dissipating member 22 of the heat-dissipating fin 20 but also can reduce the cost of the heat-dissipating fin 20. Further, the smaller-size through-holes 221 near the side of the insertion/press-fit member 21 can increase the strength of the insertion/press-fit member 21. The heat-conduction pipe 10 has a contact region 11 contacting the LED illumination module 30 and effectively conducting heat to the heat-conduction pipe 10. The LED illumination module 30 is formed of a plurality of LED's 5 aligned in a row. The casing 40 has an accommodation space 41 accommodating the heat-dissipating fin 20, the heat-conduction pipe 10 and the LED illumination module 30. Several via-holes 42 are formed on at least one surface of the accommodation space 41 to facilitate the heat dissipation of the heat-dissipating fin 20.

Refer to FIGS. 2A, 2B and 3. The LED heat-dissipating module 1 of the present invention, the LED illumination module 30 is installed on the contact regions 11 of several heat-conduction pipes 10 inserted into or press-fitted to the heat-dissipating fins 20; thus, the heat generated by the LED illumination module 30 can be effectively dissipated.

Together with the heat-conduction pipe 10 inserted into or press-fitted to the heat-dissipating fin 20, the LED illumination module 30 is placed inside the casing 40 having an accommodation space 41; thus, heat can be conducted via the heat-conduction pipe 10 to the heat-dissipating fin 20 and then fast dissipated therefrom even though the LED illumination module 30 is placed inside the casing 40. Refer to FIGS. 9, 10, 11 and 12. The heat-conduction pipe 10 (10 or 10a) may have a variety of contours to meet the shapes of various accommodation spaces 41 of the casing 40. As the casing 40 has an accommodation space 41, it can be used as the housing of a LCD panel or a monitor.

Refer to FIGS. 5A, 5B, 6, 7, 8 and 13. The LED heat-dissipating module 1 of the present invention, the heat-dissipating fin 20 (20a, 20b, 20c, or 20d) of the LED heat-dissipating module and the heat-dissipating member 22 (22a, 22b, 22c, or 22d) thereof may have a variety of geometric shapes to meet the shapes of the heat-conduction pipe 10 (10 or 10a). Further, the insertion/press-fit member 21 of the heat-dissipating fin 20 may have a variety of embodiments (21a, 21b, 21c and 21d) to realize the same function.

What is claimed is:

1. A light-emitting diode heat-dissipating module for a liquid crystal display comprising a heat-dissipating fin, a heat-conduction pipe, a light-emitting diode illumination module and a casing, wherein one side of said heat-dissipating fin has an insertion/press-fit member whereby said heat-dissipating fin is inserted by or press-fitted to said heat-conduction pipe; the other side of said heat-dissipating fin has a heat-dissipating member, and said heat-dissipating member has a plurality of through-holes, and the size of said through-holes increases from the side near said insertion/press-fit member of said heat-dissipating fin to the other side; said heat-conduction pipe has a contact region contacting said light-emitting diode illumination module; said casing being a housing for said liquid crystal display and having an accommodation space accommodating said heat-dissipating fin, said heat-conduction pipe and said light-emitting diode illumination module; several via-holes are formed on at least one surface of said accommodation space to facilitate the heat dissipation of said heat-dissipating fin.

2. The light-emitting diode heat-dissipating module according to claim 1, wherein said heat-conduction pipe can have a variety of contours to meet the shapes of various said accommodation spaces of said casings.

3. The light-emitting diode heat-dissipating module according to claim 1, wherein said heat-dissipating fin can have a variety of geometric shapes to meet the shapes of said heat-conduction pipe.

4. The light-emitting diode heat-dissipating module according to claim 1, wherein said through-holes are of the same size.

* * * * *